United States Patent [19]

Loncar et al.

[11] Patent Number: 5,500,593
[45] Date of Patent: Mar. 19, 1996

[54] PHASE ROTATED SPOILING FOR SPATIAL AND SPECTRAL SATURATION TECHNIQUES

[75] Inventors: Mark J. Loncar, Willoughby Hills; James B. Murdoch, Solon; Rao P. Gullapalli, Richmond Heights, all of Ohio

[73] Assignee: Picker International, Inc., Highland Heights, Ohio

[21] Appl. No.: 344,372

[22] Filed: Nov. 23, 1994

[51] Int. Cl.$^6$ .............................. G01V 3/00; G01V 3/14
[52] U.S. Cl. ....................... 324/307; 324/309; 324/314
[58] Field of Search ................................. 324/307, 309, 324/314

[56] References Cited

U.S. PATENT DOCUMENTS

| | | | |
|---|---|---|---|
| 5,055,790 | 10/1991 | Siuciak et al. | 324/309 |
| 5,311,133 | 5/1994 | Dannels | 324/309 |
| 5,329,231 | 7/1994 | Hatta et al. | 324/309 |
| 5,347,218 | 9/1994 | Van Yperen | 324/309 |

OTHER PUBLICATIONS

"An Analysis of Fast Imaging Sequences With Steady–State Magnetization Refocusing", Zur, et al., SMRM 1987, pp. 894–895.

"The Application of Steady–State Free Precession (SFP) in 2D–FT MR Imaging", Gyngell, et al., SMRM 1986, p. 666–667.

"Elimination of Transverse Coherences in FLASH MRI", Crawley, et al., Magnetic Resonance in Medicine, 8, 248–260 (1988).

*Primary Examiner*—Sandra L. O'Shea
*Assistant Examiner*—Mack Haynes
*Attorney, Agent, or Firm*—Fay, Sharpe, Beall, Fagan, Minnich & McKee

[57] ABSTRACT

Magnets (12) create a temporally constant magnetic field through an examination region (14). Radio frequency coils (26, 34) and a transmitter (24) transmit radio frequency saturation pulses (52) and the resonance excitation and manipulation pulses of a magnetic resonance imaging sequence (72) into the examination region. Gradient amplifiers (20) and gradient coils (22, 32) create magnetic field gradients across the examination region for spatially focusing the saturation, for spoiling (62, 66, 70) residual transverse magnetization and for frequency and phase encoding in the magnetic resonance imaging sequence. A sequence controller (40) includes a saturation pulse controller (44) for generating the saturation pulse (52) and slice select gradients (58) and a steady state sequence controller (48) for generating the imaging sequence (72). The saturation is spectrally focused by limiting the frequency of the saturation pulse to selected frequencies. The saturation is spatially focused by applying the slice or other spatially limiting gradient pulses concurrently with the radio frequency saturation pulse. A phase shift controller (76) increments the phase of the RF saturation pulse by a preselected phase increment, e.g., 105°. Preferably, the phase shift increment increases linearly in each cyclic repetition, i.e., increases 105° in the first repetition, 210° in the next repetition, 315° in the next repetition, etc. A reconstruction processor (80) reconstructs resonance signals generated during the imaging sequences into an image representation for storage in a memory (82) and display on a video monitor (86).

13 Claims, 2 Drawing Sheets

PHASE ROTATED SPOILING FOR SPATIAL AND SPECTRAL SATURATION TECHNIQUES

BACKGROUND OF THE INVENTION

The present invention relates to the magnetic resonance imaging and spectroscopy arts. It finds particular application in conjunction with steady-state magnetic resonance imaging techniques and will be described with particular reference thereto.

Heretofore, numerous steady-state magnetic resonance imaging techniques have been developed. Steady-state imaging techniques have very short repeat times. For human tissue subjects, the T1 and T2 relaxation times commonly exceed the repetition time. That is, the component of the transverse magnetization created by an earlier RF pulse is still present when the next RF pulse is applied. Thus, at any point in time during the sequence, there is cumulative transverse coherent signal which is the superposition of all decaying components remaining from earlier repetitions. The longer the T2 relaxation time relative to the repetition time, the more heavily T2 weighted the cumulative coherent signal becomes.

One technique for spoiling transverse coherences built-up between successive repetition intervals of a steady-state sequence is the application of spoiler gradients. See Crawley, et al., "Elimination of Transverse Coherences in FLASH MRI", Mag. Res. in Medicine, Vol. 8, pp. 248–260, 1988. In the Crawley technique, spoiler gradients are applied whose amplitudes change linearly with the phase encode step. The effect of such spoilers at a given location along the gradient is equivalent to the effect on the entire field of view of an increased phase shift applied to the radio frequency pulse. An appropriate RF phase shift scheme should spoil residual magnetization components in steady-state imaging.

For two-dimensional and volumetric imaging, the steady-state imaging sequence is typically preceded by a presaturation RF pulse. In many techniques, the RF pulse is applied concurrently with the slice select gradient. The presaturation pulse and slice select gradient saturate selected regions of the volume to eliminate contributions therefrom. Spoiler gradients along each of the three orthogonal gradient axes are applied between the presaturation pulse and the steady-state imaging sequence. In some techniques, the phase of the presaturation RF pulse is reversed in alternate applications. One of the drawbacks to this technique is that the duration of the spoiler gradient pulses add a significant duration to the very short repetition times of steady-state sequences.

Steady-state techniques are also used in sequences that require spectral saturation. In a spectral saturation sequence, a narrowed RF pulse is tailored such that selected frequencies are irradiated so that only a selected spectral band(s) is saturated, e.g. the methyl and methylene resonances of fat are saturated to suppress the response from fat.

The present invention provides a new and improved imaging technique which overcomes the above-referenced problems and others.

SUMMARY OF THE INVENTION

In accordance with one aspect of the present invention, a method of steady-state magnetic resonance is provided. A series of steady-state magnetic resonance sequences are provided, each sequence preceded by either (i) a presaturation pulse and simultaneously applied slice select gradient or (ii) a spectrally specific saturation pulse followed by a spoiler gradient pulse, or both (i) and (ii). The phase of the RF saturation pulse or pulses is changed with each repetition.

In accordance with another aspect of the present invention, a magnetic resonance imaging apparatus is provided. The apparatus provides a strong temporally constant magnetic field through an examination region. Gradient coils and gradient amplifiers are provided for creating magnetic field gradients along three orthogonal axes through the examination region. A radio frequency transmitter and radio frequency coil are provided for applying radio frequency saturation, resonance excitation, and manipulation pulses. A radio frequency receiver receives magnetic resonance signals from the examination region. A sequence control for the radio frequency transmitter and the gradient amplifiers causes the application of any of the multiplicity of steady-state imaging sequences. Before each repetition of the imaging sequence, a spatially focused radio frequency saturation pulse is applied. A phase shift controller is provided for changing the phase of the saturation pulse in each repetition.

In accordance with a more limited aspect of the present invention, the phase of the saturation pulse is incremented by an increasing increment in each cyclic repetition.

In accordance with a more limited aspect of the present invention, the phase shift between saturation pulses in successive cyclic repetitions is incremented linearly.

In accordance with a more limited aspect of the present invention, the linear phase shift increment is 105°.

One advantage of the present invention is that it reduces the duration of the x, y, and z-gradient spoiler pulses by up to 60%.

Another advantage of the present invention is that it reduces stimulated echoes.

Another advantage of the present invention is that it reduces leftover transverse magnetization.

Another advantage of the present invention is that it increases throughput on magnetic resonance scanners.

Still further advantages of the present invention will become apparent to those of ordinary skill in the art upon reading and understanding the following detailed description of the preferred embodiments.

BRIEF DESCRIPTION OF THE DRAWINGS

The invention may take form in various components and arrangements of components, and in various steps and arrangements of steps. The drawings are only for purposes of illustrating a preferred embodiment and are not to be construed as limiting the invention.

DETAILED DESCRIPTION OF THE PREFERRED EMBODIMENT

Figure 1:
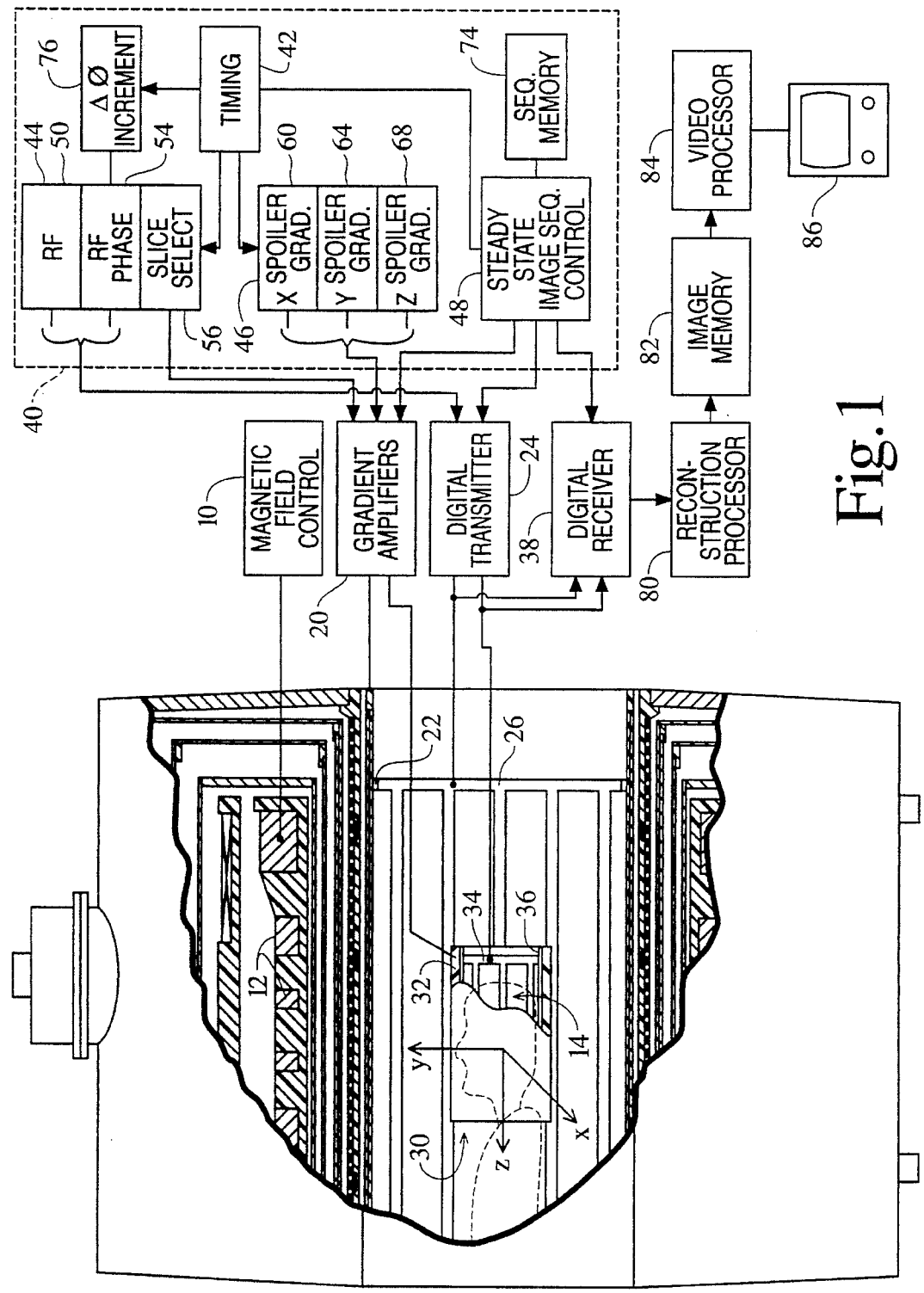
FIG. 1 is a diagrammatic illustration of magnetic resonance imaging apparatus in accordance with the present invention.

With reference to FIG. 1, a main magnetic field control 10 controls superconducting or resistive magnets 12 such that a substantially uniform, temporally constant magnetic field is created along a z-axis through an examination region 14. A magnetic resonance echo means applies a series of radio frequency (RF) and magnetic field gradient pulses to invert or excite magnetic spins, induce magnetic resonance, manipulate magnetic resonance, spatially and otherwise encode the magnetic resonance, to saturate spins, and the like to bring about magnetic resonance imaging and spectroscopy sequences. More specifically, gradient pulse amplifiers 20 apply current pulses to selected ones or pairs of whole body gradient coils 22 to create magnetic field gradients along x, y, and z-axes of the examination region 14. A digital radio frequency transmitter 24 transmits radio frequency pulses or pulse packets to a whole body RF coil 26 to transmit RF pulses into the examination region. A typical radio frequency pulse is composed of a packet of immediately contiguous pulse segments of short duration which taken together achieve a selected magnetic resonance manipulation. The RF pulses are used to saturate, excite resonance, invert magnetization, or manipulate resonance in selected portions of the examination region. For whole body applications, the resonance signals are commonly picked up by the whole body RF coil 26.

For generating images of limited regions of the subject, local coils are commonly placed contiguous to the selected region. For example, an insertable head coil 30 is preferably inserted surrounding a selected brain region at the isocenter of the bore. The insertable head coil optionally includes local gradient coils 32 which receive current pulses from the gradient amplifiers 20 to create magnetic field gradients along x, y, and z-axes in the examination region within the head coil. A local radio frequency coil 34 is used to excite magnetic resonance and receive magnetic resonance signals emanating from the patient's head. Alternatively, a receive-only local coil can be used in conjunction with body-coil transmission. An RF screen 36 blocks the RF signals from the RF head coil from inducing eddy currents in the RF gradient coils and the surrounding structures.

A sequence control 40 controls the gradient pulse amplifiers 20, the digital transmitter 22, and a digital radio frequency receiver 38. More specifically, the sequence control means includes a timing means or processor 42 which provides the basic timing signals for the series of magnetic resonance imaging sequences. The timing means 42 cyclically actuates a saturation pulse generator 44, a spoiler gradient generator 46, and a steady-state sequence control 48.

Figure 2:
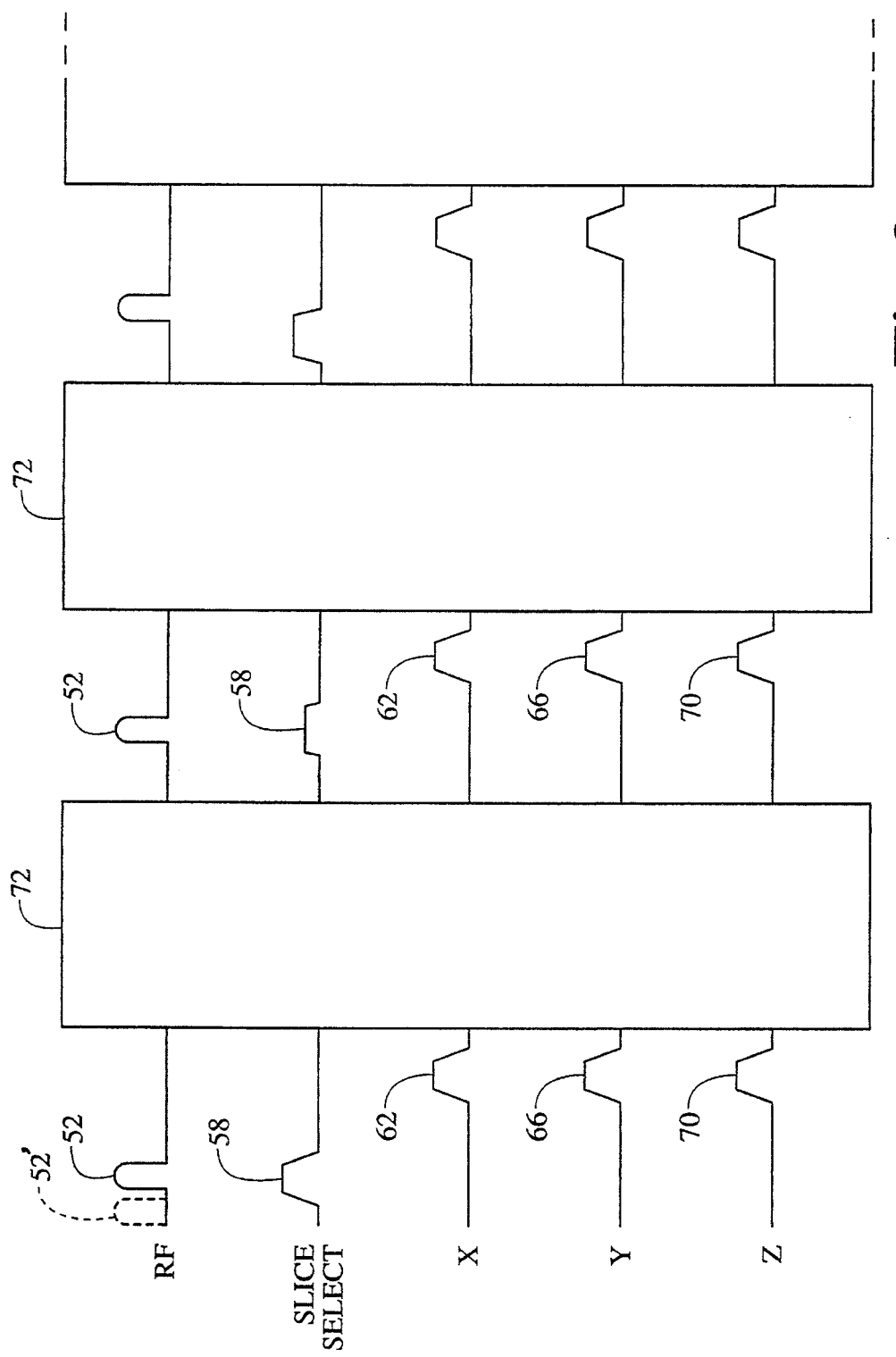
FIG. 2 is a timing diagram of a preferred imaging sequence in conjunction with the present invention.

With continuing reference to FIG. 1 and further reference to FIG. 2, the saturation pulse generator 44 generates a spatially or spectrally focused saturation pulse waveform, which is passed to the RF transmission chain 50. Preferably, the RF pulse is narrowband, i.e., frequency specific to saturate a selected tissue such as fat or when applied in the presence of a slice-select gradient, capable of saturating a well-defined slice. An RF pulse phase controller 54 controls the phase of the RF saturation pulse 52. In a spatial suppression embodiment, a slice select controller 56 controls the current amplifiers 20 to cause a slice select pulse 58 which controls the region of the volume of interest that is to be saturated. The slice select gradient can focus the saturation spatially on a well-defined slice of predetermined thickness, a pair of spaced parallel slices, or the like. Although illustrated on a separate line, it is to be appreciated that the slice select gradient can be applied along any of the x, y, and z-axes or obliquely. The spatial saturation pulse 52 and gradient 58 are followed by spoiler gradient pulses 62, 66, and 70. It is these gradient pulses that can be shortened without adverse effect on image quality when the saturation pulse RF phase is shifted appropriately. In another embodiment, a spectral saturation pulse 52' is applied to suppress signals from fat or other selected tissue throughout the imaging volume. The spectral saturation pulse is immediately followed by the spoiler gradients 62, 66, and 70. Again, these spoiler gradients can be shortened when the phase of the pulse 52' is shifted appropriately. In another embodiment, spectral saturation pulse 52', spatial saturation pulse 52, and slice-select gradient 58 are all applied as shown for combined spatial and spectral presaturation.

The spoiler gradient generator 46 includes an x-spoiler gradient control 60 which generates an x-spoiler gradient 62, a y-spoiler gradient control 64 for generating a y-spoiler gradient 66, and a z-spoiler gradient control 68 selectively creates a z-spoiler gradient 70.

After the presaturation and spoiler gradients have been applied, the timing means 42 actuates the steady-state sequence controller 48 which causes a steady-state sequence, such as FAST sequence or repetition 72 to be run. Preferably, a sequence memory 74 stores other steady-state sequences, e.g., FLASH, CEFAST, three-dimensional imaging sequences, and the like which the operator can also select. The sequence memory further stores spectral saturation sequences such as MTC, FATSAT, and the like.

The evolution of magnetization during a magnetic resonance imaging sequence can be described as a series of rotations of the magnetization vector about a series of axes. Each rotation of the magnetization can be written as follows:

$$m_2 = R.m_1 \tag{1}$$

where $m_1$ is the initial magnetization (which can be described by a three-element vector), $m_2$ is the final magnetization, and R is a rotation operator (which can be described by a 3×3 matrix). Moreover, the product of any two rotations is also a rotation:

$$R_C = R_B \cdot R_A \tag{2}$$

A few specific rotations are defined as follows:

$R_Z(\beta)$ rotation about the z-axis of the rotating frame by an angle $\beta$ $R_X(\alpha)$ rotation about the x-axis of the rotating frame by an angle $\alpha$ $R_Y(\alpha)$ rotation about the y-axis of the rotating frame by an angle $\alpha$ $R_\phi(\alpha)$ rotation by an angle $\alpha$ about an axis in the x-y plane of the rotating frame that is an angle $\phi$ away from the x-axis (i.e., $R_Y(\alpha) \equiv R_\phi(\alpha)$ for $\phi = 90°$).

A useful rotation relationship is:

$$R_{100}(\alpha) = R_Z(-\phi).R_X(\alpha).R_Z(\phi) \tag{3}$$

These particular rotations have been singled out for a reason. The evolution of magnetization between RF pulses is described by a rotation about the z-axis of the rotating frame, and the rotation angle is given by:

$$\beta = 2\pi \gamma g . r \tau \tag{4}$$

where $\gamma$ is the gyromagnetic ratio, g is the magnetic field gradient vector $\{G_X, G_Y, G_Z\}$, r is the position vector $\{x,y,z\}$ relative to isocenter, and $\tau$ is the time interval between RF pulses.

Hard RF pulses are described by rotations about axes in the x-y plane of the rotating frame: the RF phase $\phi$ defines which axis and the tip angle $\alpha$ defines the rotation about that axis. (Soft—i.e., selective—pulses can be formulated as an alternating series of hard pulses and delays, so the follow applies to them also.)

In a rapid imaging sequence, the repeat time TR is typically much less than tissue $T_1$ and $T_2$ values, and periodic excitation gives rise to a non-equilibrium steady-state magnetization response. If no RF spoiling is applied and all phase gradients are "rewound" after application, then the repeating unit of the periodic excitation is one TR unit long. For most such sequences, the read gradient does not average to zero over the TR period and there is a 360° spread of dephase angles (rotations about the z-axis caused by the net effect of the read gradient) across each pixel. As such, the signal acquired is a pixel-averaged steady-state.

If the phase-encoding gradient lobe is incremented linearly from view to view (as is typically done) but is not rewound after each data acquisition, then there is an additional rotation about the z-axis per TR period that increments linearly and depends on position along the phase-encoding axis of the image. The increment angle X is 180° at one edge of the phase-encoded field of view (FOV), −180° at the other edge, and zero at the center (where the phase-encoding gradient has no effect). On the line one fourth of the way from the center to the edge of the phase-encode FOV, the increment X is 45°: as the gradient is stepped from view to view, the extra rotation about the z-axis goes as 45°, 90°, 135°, 180°, 225°, . . . The effective repeat length for periodic excitation is 8 TR in this case, and the net contribution of residual transverse magnetization to the signal is different than at other lines perpendicular to the phase-encode axis, as detailed in the above-referenced paper by Crawley, Wood, and Henkelman. The brightest band occurs at the center of the image (where X=0), and other bright bands occur when X equals m*360°/n, where m and n are small integers (e.g., m=1 and n=8 for 45°). Lower signal-to-noise but better $T_1$-weighted contrast is achieved away from the bands. It has been found by simulation and experiment that a good choice for X is 105° (m=7,n=24). In the context of efficient saturation, a X value is wanted that maximizes the destructive interference of residual transverse magnetization from undesirable features in the image—here too 0°, 180°, or 45° would be a bad choice for X, and 105° is a good choice.

It is undesirable to improve contrast or maximize saturation in a position-dependent manner. Hence, phase-encoding gradients are rewound after each acquisition to eliminate the spatial dependence. RF phase cycling is used to generate an effective rotation about the z-axis that increments linearly for all excited nuclei. Consider those nuclei that experience a net rotation β about the z-axis between pulses as a result of read gradients, slice gradients, field inhomogeneity, etc. Apply an equally-spaced set of RF pulses of tip angle α and phases $\phi_1$, $\phi_2$, $\phi_3$, $\phi_4$, . . . The magnetization evolves as follows:

$$m = \ldots R_Z(\beta).R_{\phi4}(\alpha).R_Z(\beta).R_{\phi3}(\alpha).R_Z(\beta).R_{\phi2}(\alpha).R_Z(\beta).R_{\phi1}(\alpha).m_{initial} \quad (5)$$

Using the relationship between $R_{100}$ and $R_X$ presented earlier, and combining successive rotations about the z-axis, this expression becomes:

$$m = \ldots R_Z(\beta).R_{Z-\phi4}.R_X(\alpha).R_Z(\beta+\phi_4-\phi_3).R_X(\alpha).R_Z(\beta+\phi_3-\phi_2).R_X(\alpha).R_Z(\beta+\phi_2-\phi_1).R_X(\alpha).R_Z(\phi_1).m_{initial} \quad (6)$$

The effective rotation about the z-axis between successive RF pulses depends on the difference in RF phases: $\phi_k - \phi_{k-1}$. If the phase of the pulses increases linearly (e.g., 0°, 45°, 90°, 135°, . . . ), the phase increment Δφ between pulses is constant (e.g., 45°). As a result, the net rotation about the z-axis changes from β to β+Δφ. However, in a pixel-averaged steady-state, the signal is averaged over a 360° range of rotations about the z-axis. Adding the Δφ term shifts the range of angles averaged from 0° through 360° to Δφ through 360°+Δφ, but does not change the average signal value. Moreover, because the z-rotation is the same in every interval, the effective repetition length is still one pulse-to-pulse interval. If, on the other hand, the phase shift increment increases linearly (e.g., 0°, 45°, 135°, 270°, 450°, . . . or more generally, $0_X$, $1_X$, $3_X$, $6_X$, $10_X$, . . . ), then the net rotation about the z-axis (governed by the difference in successive pulse phases) increases linearly: 45°−0°=45°, 135°−45°=90°, 270°−135°=135°, . . . (ignoring the constant β contribution here for simplicity). The result is akin to the case of the non-rewound phase-encoding gradient, but without the bothersome banding. In particular, the effective repetition length is more than one TR period. Using an appropriate X value—such as the aforementioned value of 105°, the destructive interference of residual transverse magnetization is maximized, and the need for spoiler gradient length thereby minimized.

As the flip angle α of the selected imaging sequence approaches the Ernst angle, i.e., cosα=exp(−TR/T1), the steady-state saturation becomes less efficient and becomes progressively insensitive to phase shifts. Accordingly, it is strongly preferred that the imaging sequence be conducted with flip angles other than the Ernst angle. Analogously, the phase increment may be adjusted in accordance with the selected flip angle.

With each repetition of the steady-state sequence, a phase shift controller 76 changes the phase φ of successive saturation pulses. In the simplest case, the phase shift Δφ can be constant.

Preferably, rather than incrementing the phase shift Δφ between successive pulses by a fixed amount, i.e., the same 105° step in each cycle, the phase shift is incremented by a linearly increasing amount. That is, for a phase shift step of a, the phase shift and phase are incremented linearly as follows:

$$\Delta\phi = a, 2a, 3a, 4a, 5a, 6a, \ldots \quad (7a)$$

$$\phi = 0, a, 3a, 6a, 10a, 15a, 21a, \ldots \quad (7b)$$

Again, a phase step of a=105° is preferred.

Alternately, other phase cycling schemes can be selected. For example, two or more phase shift indexed increment sequences may be implemented alternately or cyclically. As yet another alternative, a random phase cycling scheme might be selected. As yet another alternative, the phase shift increment control can be replaced by a phase memory which stores a preselected series of RF phases which are precalculated based on the above-discussed schemes or others.

Magnetic resonance signal echoes or other signals generated during the imaging sequence 72 are received by the radio frequency coil 34 and the digital receiver 38. The received and demodulated resonance signals are reconstructed with a reconstruction processor 80 into a volume image representation. In the preferred embodiment, the reconstruction processor 80 uses three-dimensional inverse Fourier transform reconstruction. The reconstructed volume image representation is stored in volume image memory 82. A memory access control and video processor 84 selectively withdraws selected portions of the volume image information in the memory 82. The video processor selectively withdraws one or a series of planes of data from the image memory, three-dimensional renderings, images composed with a plurality of operator designated cut planes, and the like, as are known in the art. The retrieved image information is converted by a video monitor 86 into a human-readable display.

The invention has been described with reference to the preferred embodiment. Obviously, modifications and alterations will occur to others upon reading and understanding the preceding detailed description. It is intended that the invention be construed as including all such modifications and alterations insofar as they come within the scope of the appended claims or the equivalents thereof.

Having thus described the preferred embodiment, the invention is now claimed to be:

1. In a magnetic resonance method in which at least a portion of a subject is disposed in an examination region of a temporally constant magnetic field and in which the subject portion in the examination region is examined by cyclically (a) applying a presaturation RF pulse focused to saturate only selected material in the subject portion, (b) applying spoiler gradients, and (c) applying a magnetic resonance sequence for generating magnetic resonance signals from non-saturated material in the examination region, which magnetic resonance signals are received and processed, the improvement comprising causing spectrally selective presaturation in the selected material by:

in each cyclic repetition, changing the phase of the presaturation radio frequency pulse independently of the phase of radio frequency pulses in the magnetic resonance sequence.

2. In the magnetic resonance imaging method of claim 1, the improvement further comprising:

incrementing the phase shift of the presaturation radio frequency pulse by a linearly increasing increment of the phase step, whereby the phase shift increment between sequential cyclic repetitions is the phase step, twice the phase step, three times the phase step, four times the phase step, and so forth.

3. A method of magnetic resonance imaging comprising:

disposing a subject which includes material having a plurality of a relaxation times including a maximum relaxation time in an examination region;

creating a temporally constant magnetic field through the examination region;

cyclically:
(i) in each cycle, applying a spatially focused radio frequency saturation pulse to cause saturation of a portion of the material in the examination region,
(ii) in each cycle, applying a steady-state imaging sequence in which a phase of radio frequency pulses of the steady-state imaging sequence remain constant from cycle to cycle and collecting magnetic resonance data from the examination region;

in each cycle, changing a phase shift of the saturation pulse such that the phase shift of the saturation changes from cycle to cycle;

reconstructing an image representation from the magnetic resonance signals.

4. The method as set forth in claim 3 wherein the phase shift has a linearly increasing increment in which after the first cycle, the phase shift is incremented by a preselected phase step, in a second repetition, the phase shift is incremented by twice the preselected phase step, in a third repetition, the phase shift is incremented by three times the incremented phase step, in a fourth repetition, the phase shift is incremented by four times the phase step.

5. The method as set forth in claim 4 wherein the phase shift increment is 105°.

6. The method as set forth in claim 3 wherein the radio frequency saturation pulse is spectrally focused.

7. The method as set forth in claim 3 wherein the radio frequency saturation pulse is applied concurrently with a spatially limiting magnetic field gradient to provide spatial focusing.

8. In a magnetic resonance imaging apparatus which includes magnets for creating a temporally constant magnetic field through an examination region, a radio frequency coil and transmitter assembly for transmitting radio frequency saturation pulses, radio frequency resonance excitation pulses, and radio frequency resonance manipulation pulses into the examination region, a receiver for receiving magnetic resonance signals emanating from the examination region, gradient coils and gradient pulse amplifiers for applying magnetic field gradients along three orthogonal axes across the examination region, a sequence controller for controlling the gradient amplifiers and the transmitter to cause the transmitter and gradient amplifiers to implement imaging and other magnetic resonance procedures which include alternate saturation pulses and magnetic resonance sequences, and a reconstruction processor for processing received magnetic resonance signals, the improvement comprising:

a means for incrementing a phase shift of the radio frequency saturation pulses without correspondingly incrementing relative phases of the radio frequency resonance excitation and manipulation pulses such that the phase shift of the radio frequency saturation pulses changes with each cyclic repetition.

9. A magnetic resonance imaging apparatus comprising:

magnets for creating a temporally constant magnetic field through an examination region;

a radio frequency coil disposed around the examination region;

a transmitter connected with the radio frequency coil for transmitting radio frequency saturation, resonance excitation, and resonance manipulation signals into the examination region;

a plurality of gradient coils disposed around the examination region for creating magnetic field gradients across the examination region;

gradient pulse amplifiers connected with the gradient coils for applying current pulses to the gradient coils for selectively creating magnetic field gradient pulses across the examination region;

a sequence controller connected with the transmitter and gradient amplifiers for cyclically (a) causing a preaturation sequence including transmitting a radio frequency presaturation pulse into the examination region for spectrally focusing saturation caused by the presaturation pulse and (b) causing the transmitter and gradient amplifiers to conduct a magnetic resonance imaging sequence which generates magnetic resonance signals;

a phase shift controller for incrementing a phase shift of the radio frequency presaturation pulse by an increasing increment with each cyclic repetition of the presaturation sequence without correspondingly incrementing the phase of radio frequency pulses in the magnetic resonance imaging sequence;

a processor for processing the magnetic resonance signals into electronic image and other representations;

a memory for storing the representations.

10. The magnetic resonance apparatus as set forth in claim 9 further including a video processor for selectively retrieving portions of the image representations stored in the memory and converting the retrieved image representation portions into video format for display on a video monitor.

11. A magnetic resonance imaging apparatus comprising:

magnets for creating a temporally constant magnetic field through an examination region;

a radio frequency coil disposed adjacent the examination region;

a transmitter connected with the radio frequency coil for transmitting RF saturation, resonance excitation, and resonance manipulation signals into the examination region;

a plurality of gradient coils disposed around the examination region for creating magnetic field gradients across the examination region;

gradient pulse amplifiers connected with the gradient coils for applying current pulses to the gradient coils for selectively creating magnetic field gradient pulses across the examination region;

a sequence controller connected with the transmitter and gradient amplifiers for cyclically (a) causing a presaturation cycle portion including an RF saturation pulse for causing spatially focused saturation and (b) causing a magnetic resonance imaging sequence portion including RF resonance excitation and manipulation pulses which induces magnetic resonance signals;

a phase incrementor which increments the phase of the RF saturation pulse by an increasing increment with each cyclic repetition without incrementing the phase of the RF resonance excitation and manipulation signals correspondingly;

a processor for processing the magnetic resonance signals into electronic image and other representations;

a memory for storing the representations.

12. The magnetic resonance apparatus as set forth in claim 9 wherein the transmitter transmits frequency specific radio frequency pulses and further including a means for selecting the frequency of the radio frequency pulses for spatially focusing the saturation pulses.

13. The magnetic resonance apparatus as set forth in claim 12 wherein the sequence controller includes a means for causing the gradient amplifiers to cause a spatial select gradient concurrently with the saturation pulse for spatially focusing the saturation.

* * * * *